US011874457B2

(12) United States Patent
Naftali et al.

(10) Patent No.: US 11,874,457 B2
(45) Date of Patent: Jan. 16, 2024

(54) MICRO-MIRROR MEMS SYSTEM

(71) Applicant: Maradin Ltd., Yoqne'am (IL)

(72) Inventors: Matan Naftali, Moshav Aloney-Aba (IL); Ran Gabai, Haifa (IL); Gil Cahana, Herzelia (IL); Menashe Yehiel, Moshav Yogev (IL)

(73) Assignee: MARADIN LTD., Yoqne' Am (IL)

( * ) Notice: Subject to any disclaimer, the term of this patent is extended or adjusted under 35 U.S.C. 154(b) by 537 days.

(21) Appl. No.: 16/950,535

(22) Filed: Nov. 17, 2020

(65) Prior Publication Data

US 2021/0149186 A1 May 20, 2021

Related U.S. Application Data

(60) Provisional application No. 62/936,509, filed on Nov. 17, 2019.

(51) Int. Cl.
*G02B 26/08* (2006.01)
*G02B 26/10* (2006.01)
*B81B 3/00* (2006.01)

(52) U.S. Cl.
CPC ........ *G02B 26/0833* (2013.01); *B81B 3/0045* (2013.01); *G02B 26/10* (2013.01); *B81B 2201/042* (2013.01); *B81B 2207/03* (2013.01)

(58) Field of Classification Search
CPC .. G02B 26/0833; G02B 26/10; G02B 26/101; B81B 3/0045; B81B 2201/042; B81B 2207/03
See application file for complete search history.

(56) References Cited

U.S. PATENT DOCUMENTS

| 7,034,370 | B2 * | 4/2006 | Kuo .................. G02B 26/0841 257/500 |
| 8,810,879 | B2 | 8/2014 | Lubianiker et al. |
| 10,061,181 | B2 | 8/2018 | Bucher et al. |
| 2020/0025840 | A1 * | 1/2020 | Bickford ................ G01R 15/00 |

OTHER PUBLICATIONS

Wikipedia, Resonance, en.wikipedia.org/w/index.php?title=Resonance&oldid=985167217, Oct. 24, 2020.

* cited by examiner

*Primary Examiner* — Euncha P Cherry
(74) *Attorney, Agent, or Firm* — Browdy and Neimark, PLLC

(57) ABSTRACT

A method for projecting an image comprising providing a scanning mirror having a resonance frequency which is unequal to a target operating frequency (aka "scanning frequency") at which the mirror is to operate; and/or providing logic and an actuator e.g. motor; and/or using the scanning mirror to project at least one image, including repeatedly using the logic to measure the mirror's operating frequency and to control the actuator to apply at least one force, to the mirror, which causes the mirror's instantaneous operating frequency to equal the target operating frequency.

20 Claims, 6 Drawing Sheets

10 = Scanning mirror, 11 = hinge, 12 = frame, 13 = X scanning axis, 14=Y scanning axis, 15=Y motor, 16=Y motion sensor
17=data from sensor, 18=voltage to motor, 19=Logic, 20=drive, 21=AC driving signal 10 = Scanning mirror, 11 = hinge, 12 = frame, 13 = X scanning axis, 14 = Y scanning axis, 15=Y motor, 16=Y motion sensor 17=data from sensor, 18=voltage to motor, 19=Logic, 20=drive, 21=AC driving signal 10 = mirror, 11 = hinge, 12 = frame

MICRO-MIRROR MEMS SYSTEM

REFERENCE TO CO-PENDING APPLICATIONS

Priority is claimed from U.S. provisional application No. 62/936,509 entitled "Active tunable resonance for using a micro-mirror MEMS" filed Nov. 17, 2019, the disclosure of which application/s is hereby incorporated by reference.

FIELD OF THIS DISCLOSURE

The present invention relates generally to MEMS technology and more particularly to MEMS scanners such as mirrors.

BACKGROUND FOR THIS DISCLOSURE

According to Wikipedia, resonance is the increased amplitude that occurs when the frequency of a force, periodically applied to a system, equals a natural frequency of the system—relative to the (typically manifoldly) lower amplitude which occurs if the same force is applied at a frequency which differs from the system's natural frequency. In a mass-spring system, the natural frequency, Omega_0, is the square root of the following fraction: spring stiffness k/mass m. Simple harmonic motion is typified by oscillation of the mass m on a spring which is subject to a force F acting to extend or compress the spring by a distance, x, where the force F is (if x is small compared to the total possible deformation of the spring) linearly related to x. Therefore, F/x is a—constant, characterizing stiffness of a given spring. Herein, $K_y$, that constant, characterizes a physical spring's stiffness. Simple harmonic motion is sinusoidal over time and has a single frequency. Vibration of an object e.g. MEMS object e.g. MEMS mirror about an axis, e.g. repeatedly moving from one azimuthal (angular) orientation to another and back, may exhibit simple harmonic motion.

Co-owned U.S. Pat. No. 8,810,879 describes a scanning micro-mirror apparatus.

U.S. Pat. No. 7,034,370 to Advanced Nano Systems Inc. describes a MEMS scanning mirror with tunable natural frequency.

U.S. Pat. No. 10,061,181B2 describes converting an input oscillation having an input frequency into an output oscillation having an output frequency by providing a controller configured for receiving the input oscillation and responsively generating a multi-component drive signal. A frequency of at least one component of the drive signal is other than two times the input frequency. A frequency of another component of the drive signal may equal about two times the output frequency. The system also comprises an oscillator for generating pump oscillations responsively to the drive signal and applying parametric excitation to the input oscillation at the pump oscillations.

The disclosures of all publications and patent documents mentioned in the specification, and of the publications and patent documents cited therein directly or indirectly, are hereby incorporated by reference, other than subject matter disclaimers or disavowals. If the incorporated material is inconsistent with the express disclosure herein, the interpretation is that the express disclosure herein describes certain embodiments, whereas the incorporated material describes other embodiments. Definition/s within the incorporated material may be regarded as one possible definition for the term/s in question.

SUMMARY OF CERTAIN EMBODIMENTS

Certain embodiments of the present invention seek to provide circuitry typically comprising at least one processor in communication with at least one memory, with instructions stored in such memory executed by the processor to provide functionalities which are described herein in detail. Any functionality described herein may be firmware-implemented or processor-implemented or hardware-implemented e.g. as electric circuitry, as appropriate.

Certain embodiments herein seek inter alia to provide an active tunable resonance frequency of MEMS devices in general and of a micro-mirror MEMS in particular. Such an active resonance frequency is advantageous inter alia as an enabler for generating a high Q (i.e. low damping) operation of the device with minimal required power.

A scanning mirror is required to scan at a scanning frequency typically dictated by an external source e.g. depending on the use-case for the device in which the mirror is embedded, and with a scanning angle sufficient to cover the desired field of view. Manufacturing tolerances, thermal effects and other physical parameters shift the mechanical resonance frequency of the scanning mirror from the desired scanning frequency. Operating the scanning mirror off the resonance requires significantly more power to scan at the desired angle of scan.

A practice which may be known, is to modify the frequency of scan to match the resonance frequency of the scanning mirror. However, sometimes the frequency of scan is constraint and cannot be altered to match the scanning mirror resonance frequency.

Certain embodiments herein are operative for actively tuning the scanning mirror, modifying the scanning system's stiffness by applying external forces to tune the mirror's resonance frequency to the scanning frequency.

Certain embodiments herein include an active feedback loop, or virtual spring, that applies an additional force to the mirror which is proportional to the scanning mirror angle, acting as an additional virtual spring that either reduces or increases the scanning mirror stiffness. The result is an augmented scanning system with resonance frequency shifted with respect to the scanning mirror itself. This augmented system includes the scanning mirror and the virtual spring.

A scanning mirror can be modeled as a resonator:

$$J_y \ddot{y} + C_d \dot{y} + K_y y = T_{drive} + T_{fshift} \tag{1}$$

wherein $J_y$ is the mass moment of inertia, $C_d$ is the damping coefficient, and $K_y$ is the mechanical stiffness or the physical spring's stiffness, as opposed to K which may be used to denote gain.

The right hand side is composed from the external forces applied to the mirror; Tdrive—the driving torque and Tfshift the feedback force shifting the frequency.

Define an internal feedback loop $T_{fshift} = K \cdot y$ and substitute into (1):

$$J_y \ddot{y} + C_d \dot{y} + (K_y - K)y = T_{drive} \tag{2}$$

From (2) it is shown that tuning the feedback gain F can affect the total stiffness of the Y axis. Thus, tuning the system's resonance frequency:

$$\omega_y = \sqrt{\frac{K_y - K}{J_y}} \tag{3}$$

Given a mirror (from a batch of mirrors manufactured to yield a target resonance frequency value) which is pivoting harmonically about at least one axis, thereby to define an operating frequency, where the mirror is spring-loaded, thereby to define a first spring operating on the mirror and a force on the mirror which is applied by said first spring, certain embodiments seek to provide, for at least one axis e.g. for each of plural axes about which the mirror pivots, a second, virtual, spring, including:

a sensor of the mirror's position or scanning angle, and/or
logic implemented in software/firmware/hardware, and/or
a motor, where the logic is typically configured as described herein, or to ensure that harmonic motion of all mirrors from the batch, all have a single operating frequency.

It is appreciated that if the mirror pivots about plural axes e.g. 2 or 3 axes, each axis may scan in its own frequency; this is application (aka use-case) determined, wherein the logic receives a reading from the sensor, multiplies the reading by a constant thereby to obtain a scalar number, and commands the motor to apply a second force, whose magnitude is proportional to the scalar number, to the mirror, wherein the logic multiplies the reading by a spring constant.

According to an embodiment of the invention, the same actuator may be used for plural mirrors (e.g. within a single batch of manufactured mirrors) even though each of the plural mirrors has a slightly different mechanical resonance frequency due to manufacturing tolerances.

Certain embodiments seek to provide a method for projecting an image comprising:

providing a target operating frequency at which a scanning mirror projecting the image is to operate (e.g. since failing to maintain a uniform operating frequency over time may reduce image quality); and/or providing a mirror whose resonance frequency is unequal to the operating frequency; and/or providing a virtual spring including logic and an actuator, wherein the logic measures the mirror's operating frequency and typically controls the actuator to apply a force to the mirror which causes the mirror's operating frequency to equal the target frequency.

Certain embodiments seek to provide a method for synchronously operating plural vibrating mirrors at a single operating frequency.

Certain embodiments seek to provide a method for causing a mirror to vibrate in a given operating frequency close to a resonance frequency of the system.

Certain embodiments seek to provide a method for operating at least one vibrating mirror which pivots about n e.g. 2 or 3 axes, at operating frequencies f1, . . . fn, synchronously such that a fixed ratio is maintained between the n frequencies at any given point in time, for each of the at least one mirror/s.

Certain embodiments seek to provide a method for operating a vibrating mirror at a desired constant vibration frequency which may not be the mirror's mechanical resonance frequency.

Certain embodiments seek to provide a method for operating a vibrating mirror which is part of a "black box" (e.g. mirror plus virtual spring) which ensures that the mirror operates at a constant frequency, and, therefore, does not require a user of the black box to constantly lock the mirror to a constant frequency. This is advantageous relative to a vibrating mirror which does not operate at a constant frequency, and, therefore, does require a user of the mirror to constantly lock the mirror to a constant frequency.

It is appreciated that the applicability of embodiments herein is not limited to a vibrating or to projecting images and may also be used for vibrating structural elements, e.g. about one or more axes, other than mirrors. Also, the applicability of embodiments herein is not limited to a vibrating mirror used to project an image, and may be used for vibrating mirrors used for other purposes.

Certain embodiments seek to provide a method for changing frequency while operating a system including a vibrating object, e.g. to as close as possible to the resonant frequency of the vibrating object.

Certain embodiments seek to provide a method for operating an element which has periodic motion e.g. scans or vibrates, the method comprising:

providing a scanning or vibrating structural element having a resonance frequency which is unequal to a target operating frequency (aka "scanning frequency") at which the scanning structural element is to operate;

providing logic and an actuator e.g. motor; and scanning with the structural element, including repeatedly using the logic to measure the structural element's operating frequency and to control the actuator to apply at least one force, to the structural element, which causes the scanning structural element's instantaneous operating frequency or vibrating frequency to equal the target operating frequency or vibrating frequency.

The use-case wherein the scanning structural element comprises a mirror and scanning includes projecting an image is but one possible use-case. Alternatively for example, a display, or an oscillator whose frequency is tuned during operation, e.g. as described herein, may be provided.

Certain embodiments seek to provide a method for using a scanning mirror e.g. for image projection or other purposes, the method comprising:

providing a scanning mirror having a resonance frequency which is unequal to a target operating frequency (aka "scanning frequency") at which the mirror is to operate (e.g. since failing to maintain a uniform operating frequency over time may reduce image quality);

providing logic and an actuator e.g. motor; and putting the scanning mirror into motion, which may or may not include using the scanning mirror to project at least one image, including repeatedly using the logic to measure the mirror's operating frequency and to control the actuator to apply at least one force, to the mirror, which causes the mirror's instantaneous operating frequency to equal the target operating frequency.

Certain embodiments seek to provide a scanning mirror system comprising:

a scanning mirror having an operating frequency which at least sometimes is unequal to a target frequency at which the mirror is to operate;

an actuator; and logic which controls the scanning mirror's scanning motion, including repeatedly providing a measurement of the scanning mirror's operating frequency, and, responsively, controlling the actuator to apply at least one force, to the mirror, which causes the mirror's instantaneous operating frequency to equal the target frequency, thereby to enhance image quality by maintaining a uniform operating frequency over time.

The terms "pivot" and "rotate" herein are used to refer to motion about an axis including repeated motion or vibration of an object e.g. MEMS object e.g. mirror, from a first azimuthal orientation relative to the axis, to a second azimuthal orientation relative to the axis, separated from the first azimuthal orientation by d degrees (typically d is less than 180 degrees), and back. The 2 orientations may be referred to as endpoints and "vibration frequency" may be the number of times per (say) second, that the object moves from the first endpoint to the second endpoint and back.

It is appreciated that all or any subset of the first and second spring, the mirror, the motor and the sensor, may all be integrated into a single MEMS structure.

The resonance of a mirror can be measured by driving the mirror with various frequencies and identifying a frequency in which the amplitude increases. It is appreciated that the designer of a system according to embodiments herein, need not know the batch resonance frequency or target resonance frequency of a batch of mirrors from which a particular scanning mirror was taken.

Certain embodiments seek to provide a mirror and associated physical and virtual springs. The mirror is seated on the physical spring. The system's resonance frequency is a combination of the mirror's mechanical resonance frequency and the contribution of the virtual spring which is used to tune the system's resonance frequency to match a desired or target operating frequency. The virtual spring is typically operative to control the mirror's vibration frequency, by changing the spring's stiffness hence changes the total (system) stiffness, thus affecting the vibration frequency of the mirror, as the mirror vibrates between 2 end-states, each being an angular orientation.

Typically, the total (e.g. system) rigidity aka stiffness, $K_y$–$K$, is the sum of the original or physical spring's stiffness, and the virtual spring's stiffness. Both springs typically have the same-signed, e.g. positive stiffness. The virtual spring typically applies a force whose direction may be with the mirror or against the mirror's angular motion, thereby to modify restoring forces acting on the mirror as if an additional physical spring, parallel to the actual physical spring, had been added to the system.

Certain embodiments seek to provide a system for projecting an image, the system operating in conjunction with a scanning mirror having a mechanical resonance frequency, the system comprising: logic; and/or an actuator, wherein, when the scanning mirror is used to project at least one image, the logic repeatedly measures the mirror's operating frequency and controls the actuator, via a driving signal, to apply at least one force to the mirror, wherein the actuator causes the mirror's operating frequency to maintain a uniform target value over time which is unequal to the scanning mirror's resonance frequency, by repeatedly setting the driving signal's frequency, in real time, to said target operating frequency, and repeatedly adjusting aka modifying a K gain value, in real time, to yield a K gain value which maximizes scanning angle amplitude and setting the logic driving signal's amplitude, in real time, to K times the scanner's instantaneous angle.

It is appreciated that $K_y$ is the stiffness of the physical spring as opposed to K aka K_gain which is the virtual spring stiffness or gain of the feedback loop constituting the virtual spring.

Certain embodiments seek to provide a mirror which vibrates or flits between first and second end-point azimuthal orientations about an axis, or about each of 1 or more (e.g. 1-3) axes, about which the mirror is rotating or pivoting.

Certain embodiments provide the mirror with a sensor which measures the mirror's current azimuthal orientation or instantaneous angle aka mirror angle, a motor which actuates the mirror's motion, and logic which controls the motor. Typically, the logic is designed to provide a "virtual spring". Typically, the logic multiplies by a spring constant which may be computed as described herein.

The frequency of this periodic movement is typically the resonance frequency, thus, for example, if the resonance frequency is 1500 Hz, the mirror typically flits between the 1 & $2^{nd}$ angular orientations 1500 times/sec.

This may be the case for each mirror within a population of mirrors e.g. a batch of (typically MEMS) mirrors, each typically including a sensor for sensing an instantaneous mirror position, the mirror and sensor both being produced using a single manufacturing process or specification, or integrally.

The manufacturing process or specification typically is designed to yield mirrors which all vibrate at a nominal or target resonance frequency—say, for example, 1500 Hz. In practice, not all mirrors vibrate at the same frequency even under the same circumstances; differences between mirrors may be up to, say 10% in either direction. Also, in practice, the same mirror does not always vibrate at the same frequency; instead the frequency depends on circumstances such as thermal effects, or more generally fluctuates during operation, typically by only a few percentage points (say perhaps 3-5%), however, even this relatively small variation can adversely affect the mirror's operational quality. For example, if the mirror is used, in conjunction with a light source, as a scanning mirror for an image projector (such a mirror may generate either pixels, or, e.g. via beam steering, may generate entire lines), even these few percentage points may adversely affect image quality e.g. by causing unwanted or artefactual distortion of the image. It is appreciated that the light source may operate continuously, to yield image lines, or may be turned on and off to yield pixels, as the mirror rotates from one azimuthal orientation to the next, each such orientation corresponding to a pixel, all as is known in the art.

A light source e.g. laser diodes/LEDs may be provided, e.g. for image projection use-cases.

PLL

An existing solution, a control loop termed herein "the PLL solution" uses a phase lock loop algorithm to determine the actual operating frequency of a given mirror (say: 1508 Hz rather than the target value of 1500 Hz), and then control the actuator (e.g. motor) given the actual e.g. as-measured resolution frequency. The PLL changes the operating frequency to match the mechanical resonance frequency. In the above example, the PLL may start by driving the mirror at 1500 Hz and may converge to driving the mirror at 1508 Hz. According to certain embodiments of the present invention, in contrast, the operating frequency may remain 1500 Hz and the virtual spring may modify the scanning mirror's system resonance frequency from 1508 Hz to 1500 Hz.

The resolution frequency may be measured by the sensor incorporated into each mirror in a MEMS manufacturing process.

It is appreciated that a (typically MEMS) mirror with 2 motors may be employed, such as Mirrorcle, Hamamatsu Microvision, ST and/or e.g. as shown in FIG. 2. For example: when projecting with stronger projection power, multiple mirrors project the same image in which case it may be critical for all mirrors to scan at the same frequency. Another use-case is synchronizing a car's two smart headlamps.

It is appreciated that any reference herein to, or recitation of, an operation being performed is, e.g. if the operation is performed at least partly in software, intended to include both an embodiment where the operation is performed in its entirety by a server A, and also to include any type of "outsourcing" or "cloud" embodiments in which the operation, or portions thereof, is or are performed by a remote processor P (or several such), which may be deployed off-shore or "on a cloud", and an output of the operation is then communicated to, e.g. over a suitable computer network, and used by, server A. Analogously, the remote processor P may not, itself, perform all of the operations, and, instead, the remote processor P itself may receive output/s of portion/s of the operation from yet another processor/s P', may be deployed off-shore relative to P, or "on a cloud", and so forth.

The present invention typically includes at least the following embodiments:

Embodiment 1. A method for projecting an image comprising:
   providing a scanning structural element e.g. scanning mirror having a resonance frequency which is unequal to a target operating frequency (aka "scanning frequency") at which the element e.g. mirror is to operate (e.g. since failing to maintain a uniform operating frequency over time may reduce image quality); and/or providing logic and an actuator e.g. motor; and/or using the scanning element e.g. mirror to project at least one image, including repeatedly using the logic to measure the element e.g. mirror's operating frequency and to control the actuator to apply at least one force, to the element e.g. mirror, which causes the element e.g. mirror's instantaneous operating frequency to equal the target operating frequency.

It is appreciated that, if the elements e.g. mirrors are MEMS implemented e.g. micro-mirrors, each individual MEMS, e.g. mirror, even in a single batch e.g. of mirrors all manufactured together, operates at a specific frequency, and has a resonance frequency characteristic of the mechanical structure of that individual MEMS. Alternatively or in addition, an individual MEMS's operating frequency may fluctuate, or shift during operation, e.g. due to temperature changes. Such a mirror may need to maintain a certain operating frequency which may have a fixed difference from the resonance frequency. A fixed driving power and associated control loop/s or virtual spring/s may regulate the frequency (e.g. each mirror's operating frequency) e.g. to maintain the above described operating frequency at a fixed distance, for that specific element e.g. mirror, from that element's e.g. mirror's resonance frequency.

Embodiment 2. The method according to any of the preceding embodiments wherein the logic is configured to modify stiffness of the scanning mirror's hinges, according to the desired resonance frequency, and wherein the stiffness is modified by controlling the actuator to apply said force to the mirror and wherein said force, at a given instant, is proportional to the instantaneous angle of the mirror.

Embodiment 3. The method according to any of the preceding embodiments wherein said logic, at least once, sets a driving signal's amplitude to a desired application's amplitude, including:
   repeatedly adjusting aka modifying a coefficient K (aka K gain value), to yield a K gain value which maximizes the amplitude of the periodic scanning motion of the mirror (aka scanning angle amplitude), and
   setting the logic driving signal's amplitude to K times the scanner's instantaneous angle relative to the scanning direction.

It is appreciated that the scanner's e.g. mirror's pivoting motion, which defines successive scanner instantaneous angles between the mirror and the scanning axis, is harmonic motion whose amplitude is termed herein the "scanning angle amplitude".

Embodiment 4. The method according to any of the preceding embodiments wherein said logic, at least once, sets a driving signal's amplitude to a desired application's amplitude, including:
   repeatedly adjusting aka modifying a K gain value, to yield a K gain value which maximizes scanning amplitude; and
   setting the logic driving signal's amplitude to K times the scanner's amplitude.

Embodiment 5. A scanning system e.g. image projection system comprising:
   a scanning structural element e.g. mirror having an operating frequency which at least sometimes is unequal to a target frequency (aka "scanning frequency" aka resonance frequency) at which the element e.g. mirror is to operate; and/or an actuator; and/or logic which controls the scanning element e.g. mirror e.g. to project at least one image, including repeatedly providing a measurement of the scanning element's e.g. mirror's operating frequency, and, responsively, controlling the actuator to apply at least one force, to the element e.g. mirror, which causes the element's e.g. mirror's instantaneous operating frequency to equal the target frequency, thereby to enhance operation quality, for example, quality of a projected image, by maintaining a uniform operating frequency over time.

Embodiment 6. The system according to any of the preceding embodiments wherein the mirror comprises a gimballed mirror.

Embodiment 7. The system according to any of the preceding embodiments wherein said actuator comprises at least one motor operatively associated with the mirror to apply torque thereto, thereby to yield periodic scanning motion of the mirror.

Embodiment 8. The system according to any of the preceding embodiments and also comprising:
   at least one driving mechanism aka drive which drives the at least one motor; and
   a signal generator aka frequency shift controller which generates a signal with a gain and phase shift relative to the measured angular position, that controls the drive including setting the periodic scanning motion's frequency.

Embodiment 9. The system according to any of the preceding embodiments and also comprising a sensor of the mirror's position or scanning angle which measures a signal proportional to the periodic scanning motion.

Embodiment 10. The system according to any of the preceding embodiments and where the logic is configured to ensure that periodic motions of all scanning mirrors from a given batch of scanning mirrors, all have a single operating frequency, thereby to provide a batch of scanning mirrors whose periodic motion's operating frequencies all equal a single target resonance frequency value (according to which the manufacturing process for the batch may have been designed), even though the resonance frequencies, of mirrors in the batch, differ within the batch due to mechanical structures of mirrors in the batch which differ within the batch due to manufacturing divergences and tolerances.

Embodiment 11. The system according to any of the preceding embodiments wherein the logic receives a reading from the sensor, multiplies the reading by a constant thereby to obtain a scalar number, and commands the motor to apply a second force, whose magnitude equals the scalar number, to the mirror, wherein the logic multiplies the reading by a spring constant.

Embodiment 12. The system according to any of the preceding embodiments wherein said logic, aka frequency shift controller, is configured to change at least one input parameter to the signal generator.

Embodiment 13. The system according to any of the preceding embodiments wherein the at least one motor and at least one driving mechanism comprises one motor and one driving mechanism.

Embodiment 14. The system according to any of the preceding embodiments wherein the at least one motor and at least one driving mechanism comprises at least two motors driven respectively by at least two driving mechanisms.

Embodiment 15. The system according to any of the preceding embodiments wherein the mirror comprises a 2D MEMS mirror whose mechanical structure defines a resonance frequency, and wherein said operating frequency is sometimes higher than the resonance frequency.

Embodiment 16. The system according to any of the preceding embodiments wherein the mirror comprises a 2D MEMS mirror whose mechanical structure defines a resonance frequency, and wherein the target frequency comprises the 2D MEMS mirror's resonance frequency, and wherein said operating frequency is sometimes lower than the resonance frequency.

Embodiment 17. The system according to any of the preceding embodiments wherein the mirror comprises a 2D MEMS mirror whose mechanical structure defines a resonance frequency, and wherein the target frequency comprises the 2D MEMS mirror's resonance frequency, and wherein said operating frequency is sometimes higher than and sometimes lower than the resonance frequency.

Embodiment 18. The system according to any of the preceding embodiments wherein the two driving mechanisms are set to be AC, and wherein two separately controllable control loops form a tunable virtual suspension which changes the resonance frequency of the MEMS.

Embodiment 19. The system according to any of the preceding embodiments wherein the resonance frequency of the MEMS changes both to higher and to lower frequencies.

Embodiment 20. The system according to any of the preceding embodiments wherein the at least two driving mechanisms are set to be AC, and wherein at least two separately controllable control loops form a tunable virtual suspension which changes the resonance frequency of the MEMS.

Embodiment 21. The system according to any of the preceding embodiments wherein the logic is configured to maintain a constant scanning amplitude within a constant frequency.

Embodiment 22. The method according to any of the preceding embodiments wherein said logic resets the driving signal's amplitude each time the scanning amplitude, aka scanning angle amplitude, is found to have changed.

Embodiments also include:

Embodiment 101: A system that comprises a 2D MEMS micro-mirror and a control circuit, that the MEMS operates at a specific frequency, and its resonance frequency is set by the mechanical structure of the MEMS, and might shift during operation due to temperature changes, and it needs to maintain a certain operating frequency with a fixed difference from the resonance frequency with a fixed driving power and a control loop to regulate the frequency.

Embodiment 102. A system according to any of the preceding embodiments wherein the operating frequency at a fixed difference from the resonance frequency may be either higher or lower from the mechanical resonance frequency of the MEMS.

Embodiment 103. A system according to any of the preceding embodiments that has at least 2 driving mechanisms and 2 control loops, that could be controlled separately and form a tunable virtual suspension which changes the system's resonance frequency of the MEMS both to higher and lower frequencies.

Embodiment 104. A system according to any of the preceding embodiments that has at least 2 driving mechanisms set to be AC, and 2 control loops, that may be controlled separately and form a tunable virtual suspension which changes the mechanical resonance frequency of the MEMS both to higher and lower frequencies.

Embodiment 105. A system according to any of the preceding embodiments that has an amplitude control mechanism to maintain a constant scanning amplitude within a constant frequency.

Embodiment 106. A system that comprises a 2D MEMS micro-mirror and a control circuit, that the MEMS operates at a specific frequency, which is designed to be its mechanical resonance frequency that is set by the mechanical structure of the MEMS, and might be different between different MEMS devices, and needs to tune the resonance frequency according to manufacturing divergences and tolerances using a frequency control loop.

Embodiment 107. A system according to any of the preceding embodiments that needs to modify its resonance frequency either higher or lower from the original designed mechanical resonance frequency of the MEMS.

Embodiment 108. A system according to any of the preceding embodiments that has at least 2 driving mechanisms and 2 control loops, that may be controlled separately and form a tunable virtual suspension which changes the resonance frequency of the MEMS.

Embodiment 109. A system according to any of the preceding embodiments that has at least 2 driving mechanisms set to be AC, and 2 control loops, that may be controlled separately and form a tunable virtual suspension which changes the resonance frequency of the MEMS.

Embodiment 110: A system according to any of the preceding embodiments that has an amplitude control mechanism to maintain a constant scanning amplitude within a constant frequency.

Also provided, excluding signals, is a computer program comprising computer program code means for performing any of the methods shown and described herein when said program is run on at least one computer; and a computer program product, comprising a typically non-transitory computer-usable or readable medium e.g. non-transitory computer-usable or readable storage medium, typically tangible, having a computer readable program code embodied therein, said computer readable program code adapted to be executed to implement any or all of the methods shown and described herein. The operations in accordance with the teachings herein may be performed by at least one computer specially constructed for the desired purposes, or general purpose computer specially configured for the desired purpose by at least one computer program stored in a typically non-transitory computer readable storage medium. The term "non-transitory" is used herein to exclude transitory, propagating signals or waves, but to otherwise include any volatile or non-volatile computer memory technology suitable to the application.

Any suitable processor/s, display and input means may be used to process, display e.g. on a computer screen or other computer output device, store, and accept information such as information used by or generated by any of the methods and apparatus shown and described herein; the above processor/s, display and input means including computer programs, in accordance with all or any subset of the embodiments of the present invention. Any or all functionalities of the invention shown and described herein, such as but not limited to operations within flowcharts, may be performed by any one or more of: at least one conventional personal computer processor, workstation or other programmable device or computer or electronic computing device or processor, either general-purpose or specifically constructed, used for processing; a computer display screen and/or printer and/or speaker for displaying; machine-readable memory such as flash drives, optical disks, CDROMs, DVDs, BluRays, magnetic-optical discs or other discs; RAMs, ROMs, EPROMs, EEPROMs, magnetic or optical or other cards, for storing, and keyboard or mouse for accepting. Modules illustrated and described herein may include any one or combination or plurality of: a server, a data processor, a memory/computer storage, a communication interface (wireless (e.g. BLE) or wired (e.g. USB)), a computer program stored in memory/computer storage.

The term "process" as used above is intended to include any type of computation or manipulation or transformation of data represented as physical, e.g. electronic, phenomena which may occur or reside e.g. within registers and/or memories of at least one computer or processor. Use of nouns in singular form is not intended to be limiting; thus the term processor is intended to include a plurality of processing units which may be distributed or remote, the term server is intended to include plural typically interconnected modules running on plural respective servers, and so forth.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements all or any subset of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention. Any of the teachings incorporated herein may, wherever suitable, operate on signals representative of physical objects or substances.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless stated otherwise, terms such as, "processing", "computing", "estimating", "selecting", "ranking", "grading", "calculating", "determining", "generating", "reassessing", "classifying", "generating", "producing", "stereomatching", "registering", "detecting", "associating", "superimposing", "obtaining", "providing", "accessing", "setting" or the like, refer to the action and/or processes of at least one computer/s or computing system/s, or processor/s or similar electronic computing device/s or circuitry, that manipulate and/or transform data which may be represented as physical, such as electronic, quantities e.g. within the computing system's registers and/or memories, and/or may be provided on-the-fly, into other data which may be similarly represented as physical quantities within the computing system's memories, registers or other such information storage, transmission or display devices or may be provided to external factors e.g. via a suitable data network. The term "computer" should be broadly construed to cover any kind of electronic device with data processing capabilities, including, by way of non-limiting example, personal computers, servers, embedded cores, computing system, communication devices, processors (e.g. digital signal processor (DSP), microcontrollers, field programmable gate array (FPGA), application specific integrated circuit (ASIC), etc.) and other electronic computing devices. Any reference to a computer, controller or processor is intended to include one or more hardware devices e.g. chips, which may be co-located or remote from one another. Any controller or processor may for example comprise at least one CPU, DSP, FPGA or ASIC, suitably configured in accordance with the logic and functionalities described herein.

Any feature or logic or functionality described herein may be implemented by processor/s or controller/s configured as per the described feature or logic or functionality, even if the processor/s or controller/s are not specifically illustrated for simplicity. The controller or processor may be implemented in hardware, e.g., using one or more Application-Specific Integrated Circuits (ASICs) or Field-Programmable Gate Arrays (FPGAs) or may comprise a microprocessor that runs suitable software, or a combination of hardware and software elements.

The present invention may be described, merely for clarity, in terms of terminology specific to, or references to, particular programming languages, operating systems, browsers, system versions, individual products, protocols and the like. It will be appreciated that this terminology or such reference/s is intended to convey general principles of operation clearly and briefly, by way of example, and is not intended to limit the scope of the invention solely to a particular programming language, operating system, browser, system version, or individual product or protocol. Nonetheless, the disclosure of the standard or other professional literature defining the programming language, operating system, browser, system version, or individual product or protocol in question, is incorporated by reference herein in its entirety.

Elements separately listed herein need not be distinct components and alternatively may be the same structure. A statement that an element or feature may exist is intended to include (a) embodiments in which the element or feature exists; (b) embodiments in which the element or feature does not exist; and (c) embodiments in which the element or feature exist selectably e.g. a user may configure or select whether the element or feature does or does not exist.

Any suitable input device, such as but not limited to a sensor, may be used to generate or otherwise provide information received by the apparatus and methods shown and described herein. Any suitable output device or display may be used to display or output information generated by the apparatus and methods shown and described herein. Any suitable processor/s may be employed to compute or generate or route, or otherwise manipulate or process information as described herein and/or to perform functionalities described herein and/or to implement any engine, interface or other system illustrated or described herein. Any suitable computerized data storage e.g. computer memory may be used to store information received by or generated by the systems shown and described herein. Functionalities shown and described herein may be divided between a server computer and a plurality of client computers. These or any other computerized components shown and described herein may communicate between themselves via a suitable computer network.

The system shown and described herein may include user interface/s e.g. as described herein which may for example include all or any subset of: an interactive voice response interface, automated response tool, speech-to-text transcription system, automated digital or electronic interface having interactive visual components, web portal, visual interface loaded as web page/s or screen/s from server/s via communication network/s to a web browser or other application downloaded onto a user's device, automated speech-to-text conversion tool, including a front-end interface portion thereof and back-end logic interacting therewith. Thus the term user interface or "UI" as used herein includes also the underlying logic which controls the data presented to the user e.g. by the system display and receives and processes and/or provides to other modules herein, data entered by a user e.g. using her or his workstation/device.

BRIEF DESCRIPTION OF THE DRAWINGS

Example embodiments are illustrated in the various drawings. Specifically.

Figure 1:
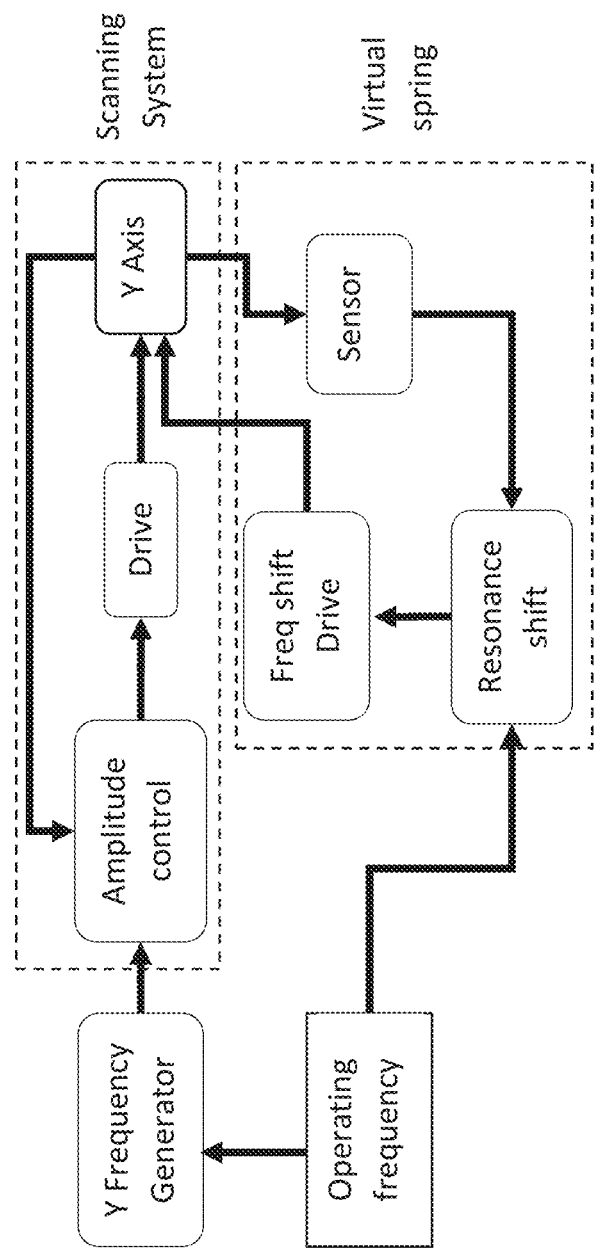
FIG. 1 is a simplified block diagram of an example system according to certain embodiments.

Certain embodiments of the present invention are illustrated in the above drawings; in the block diagrams, arrows between modules may be implemented as APIs and any suitable technology may be used for interconnecting functional components or modules illustrated herein in a suitable sequence or order e.g. via a suitable API/Interface. For example, state of the art tools may be employed, such as but not limited to Apache Thrift and Avro which provide remote call support. Or, a standard communication protocol may be employed, such as but not limited to HTTP or MQTT, and may be combined with a standard data format, such as but not limited to JSON or XML.

Methods and systems included in the scope of the present invention may include any subset or all of the functional blocks shown in the specifically illustrated implementations by way of example, in any suitable order e.g. as shown. Flows may include all or any subset of the illustrated operations, suitably ordered e.g. as shown. Tables herein may include all or any subset of the fields and/or records and/or cells and/or rows and/or columns described.

Computational, functional or logical components described and illustrated herein can be implemented in various forms, for example, as hardware circuits such as but not limited to custom VLSI circuits or gate arrays or programmable hardware devices such as but not limited to FPGAs, or as software program code stored on at least one tangible or intangible computer readable medium and executable by at least one processor, or any suitable combination thereof. A specific functional component may be formed by one particular sequence of software code, or by a plurality of such, which collectively act or behave or act as described herein with reference to the functional component in question. For example, the component may be distributed over several code sequences such as but not limited to objects, procedures, functions, routines and programs and may originate from several computer files which typically operate synergistically.

Each functionality or method herein may be implemented in software (e.g. for execution on suitable processing hardware such as a microprocessor or digital signal processor), firmware, hardware (using any conventional hardware technology such as Integrated Circuit technology) or any combination thereof.

Functionality or operations stipulated as being software-implemented may alternatively be wholly or fully implemented by an equivalent hardware or firmware module, and vice-versa. Firmware implementing functionality described herein, if provided, may be held in any suitable memory device and a suitable processing unit (aka processor) may be configured for executing firmware code. Alternatively, certain embodiments described herein may be implemented partly or exclusively in hardware, in which case all or any subset of the variables, parameters, and computations described herein may be in hardware.

Any module or functionality described herein may comprise a suitably configured hardware component or circuitry. Alternatively or in addition, modules or functionality described herein may be performed by a general purpose computer, or more generally by a suitable microprocessor, configured in accordance with methods shown and described herein, or any suitable subset, in any suitable order, of the operations included in such methods, or in accordance with methods known in the art.

Any logical functionality described herein may be implemented as a real time application, if and as appropriate, and which may employ any suitable architectural option, such as but not limited to FPGA, ASIC or DSP or any suitable combination thereof.

Any hardware component mentioned herein may in fact include either one or more hardware devices e.g. chips, which may be co-located or remote from one another.

Any method described herein is intended to include within the scope of the embodiments of the present invention also any software or computer program performing all or any subset of the method's operations, including a mobile application, platform or operating system e.g. as stored in a medium, as well as combining the computer program with a hardware device to perform all or any subset of the operations of the method.

Data can be stored on one or more tangible or intangible computer readable media stored at one or more different locations, different network nodes or different storage devices at a single node or location.

It is appreciated that any computer data storage technology, including any type of storage or memory and any type of computer components and recording media that retain digital data used for computing for an interval of time, and any type of information retention technology, may be used to store the various data provided and employed herein. Suitable computer data storage or information retention apparatus may include apparatus which is primary, secondary, tertiary or off-line; which is of any type or level or amount or category of volatility, differentiation, mutability, accessibility, addressability, capacity, performance and energy use, and which is based on any suitable technologies such as semiconductor, magnetic, optical, paper and others.

DETAILED DESCRIPTION OF CERTAIN EMBODIMENTS

The following terms may be construed either in accordance with any definition thereof appearing in the prior art literature or in accordance with the specification, or to include in their respective scopes, the following:

Resonance is intended to include references to increased amplitude that occurs for a certain frequency (resonance frequency) of a periodically applied force.

A spring is intended to include any physical or virtual object which, responsive to a force which may cause the object to deform or change its length, applies a restoring force and conversely, when a force is applied e.g. to the object, the object responsively applies a restoring force which causes a deformation.

A torsional spring is intended to include any physical or virtual object, which, when twisted, applies a restoring moment. Conversely, when a moment is applied to the object, its angle is twisted.

A torsional spring is 'virtual' if generation of the twist-moment (displacement-force) relationship is not mechanical, and is instead provided by a sensor coupled with logic and drive.

A beam or hinge is intended to include any structural element which both supports the mirror and facilitates the mirror's typically periodic angular or azimuthal scanning motion, which may define a resonance frequency. Typically, the hinges attach the mirror to a frame and are formed of a material and geometry flexible enough (i.e. with low enough stiffness) to facilitate a desired extent of twist motion on the part of the supported mirror. Typically, the twist motion of the mirror is periodic. According to certain embodiments, the hinges are flexible elements which connect the mirror to the frame. The hinges' geometric configuration typically allows angular (twist) motion around their axis and typically prevents any other type of motion of the mirror. In MEMS devices the hinges, mirror and frame may be manufactured as a single monolithic typically silicone structure.

A scanner angle aka scanning angle aka scanning mirror angle is intended to include a angle between a mirror's angular orientation to a reference angular orientation such as the mirror's angular orientation at rest.

An "instantaneous angle" is intended to include an angle (e.g. scanner angle) which is not static and may be measured in real time.

Resonance frequency of the mirror means a frequency at which increased amplitude occurs, in a system which includes a scanning mirror supported by hinges which together form a physical torsional spring.

Resonance frequency of the system means a frequency at which increased amplitude occurs, in the embodiments herein, which include not only a scanning mirror supported by hinges which together form a physical torsional spring, but also a virtual spring including:
- a sensor of the mirror's position or scanning angle, and/or
- a motor, and/or
- logic implemented in software and/or firmware and/or hardware, typically configured as described herein, or to ensure that harmonic motion of all mirrors from the batch, all have a single operating frequency.

It is appreciated that any reference herein to "mirrors" as opposed to scanning structural elements in general, is merely by way of example.

Certain embodiments seek to provide scanning mirrors whose operating frequency is as close as possible to their resonance frequency.

Certain embodiments seek to add, to a scanning mirror system, a virtual spring which changes the frequency at which the system operates e.g. if the operating frequency strays from the resonance frequency. It is appreciated that an object's stiffness affects the resonance frequency. Thus, to decrease the resonance frequency e.g. by 10 Hz, one might either change the object's (e.g. mirror's) mass or inertia, which is impractical in certain use-cases, or one might change the object's stiffness, e.g. by adding a virtual spring, parallel to a physical spring e.g. a hinge supporting the mirror.

Certain embodiments seek to provide active tunable resonance for using a micro-mirror MEMS.

FIG. 1 illustrates an example feedback loop of an active tunable resonance system. The lower area may be an addition to the classic closed loop feedback circuit. The lower area enables an independent additive or counter drive, or "power drive", to the MEMS.

In contrast to a possible approach of tuning the natural or mechanical resonance frequency of a MEMS scanning mirror using a DC voltage to modify the stiffness of the MEMS mirror, certain embodiments seek to use AC voltage which is the result of a feedback loop which typically resembles a virtual spring and typically modifies the MEMS mirror stiffness dynamically.

A scanning mirror is scanning by carrying a periodic motion around an axis covering some angular section in space. The scanner can have plural e.g. 2 or 3 axes, around each of which a periodic motion occurs.

Certain embodiments herein work on even a single axis of a scanning MEMS mirror. The mirror can have either single or dual axes. Certain embodiments herein work on each axis independently.

It is desired for a MEMS scanning mirror to scan at its own resonance frequency. This allows achieving large scanning angles with considerably low power.

However, typically, during a scanning operation, the mechanical resonance frequency continuously changes. One approach [used by many algorithms—PLL etc.] is to track the resonance frequency changes and modify the scanning frequency in real time to follow the resonance frequency changes.

Certain embodiments are operative to actively maintain the resonance frequency at a desired value rather than following or adapting to the changes of the resonance frequency.

A scanning device typically includes all or any subset of:
(a) A mechanical scanning device typically including a mirror, which scans by rotating periodically around its scanning axis.
MEMS mirrors are commercially available from Microvision and/or from ST microelectronics. The mirror may be integrally formed with a sensor, as a single MEMS structure.
(b) A motor which applies torque to the scanner, able to create the required periodic scanning motion.
(c) A power driver aka drive or power drive, able to provide the required power to the motor.

(d) A signal generator which generates a periodic scanning profile that is injected into the power driver. The scanning frequency is typically set by the signal generator.

Figure 2A:
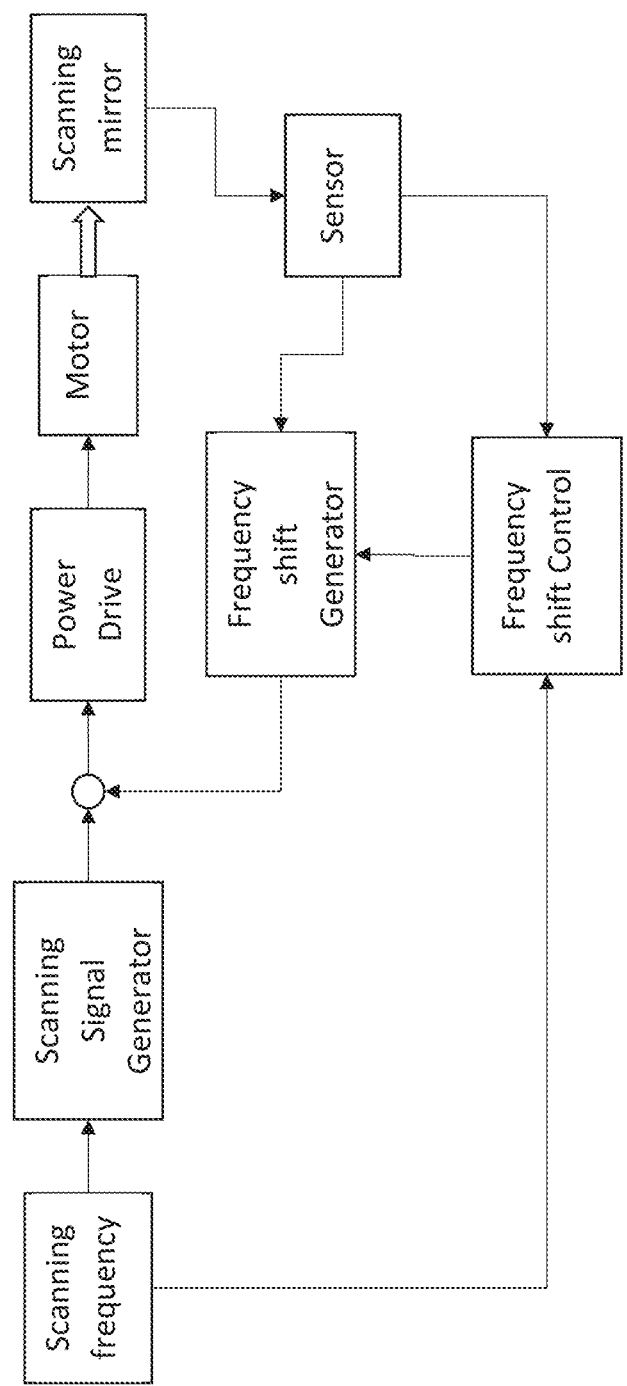
FIG. 2*a* is a simplified block diagram of an architecture with a single motor and power drive.
Figure 2B:
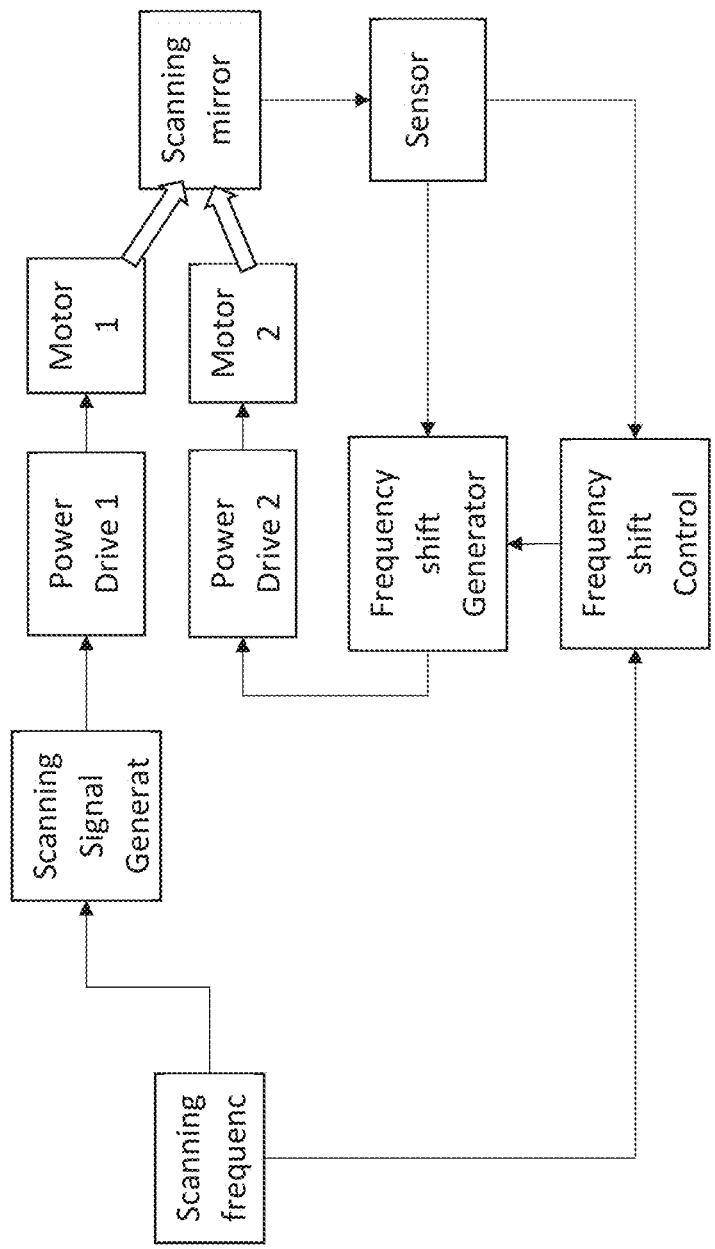
FIG. 2*b* is a simplified block diagram of a configuration which includes two power drives and two motors.

An active frequency shifting module typically includes all or any subset of:
(a) A sensor that measures angular displacement of a signal proportional to the instantaneous scanner scanning motion.
(b) A signal generator that generates a signal with a desired gain and phase shift, thus generating the desired aka target frequency.
(c) A frequency shift controller or logic that changes the signal generator parameters. The output of this module or frequency shift controller may be fed back, as an additional driving source to the scanner. This signal may be added to the scanner driving signal e.g. as shown in FIG. 2a or injected to an additional motor to apply additional torque to the scanner e.g. as shown in FIG. 2b.

Defining the scanner angle as y(t), a scanning mirror can be modeled as a resonator:

$$J\ddot{y}+C_d\dot{y}+K_y y=T_1+T_2$$

wherein J is the mass moment of inertia, $C_d$ is the damping, and $K_y$ is the stiffness. The right-hand side is composed from the external forces applied to the mirror, $T_1$—the driving torque and $T_2$—the feedback force shifting the frequency. The signal generator within the frequency shift module plays the role of a virtual spring attached to the system, hence effectively modifying the system's stiffness. It generates a signal with amplitude proportional, with proportionality coefficient K, to the scanner's instantaneous angle. The generator output would be $$T_2(t)=K\cdot y(t).$$

Thus, the entire system model can be rewritten as:

$$J\ddot{y}+C_d\dot{y}+(K_y-K)y=T_1.$$

The resonance frequency of the system may be $$\omega_n=\sqrt{\frac{K_y-K}{J_y}}.$$

Figure 5:
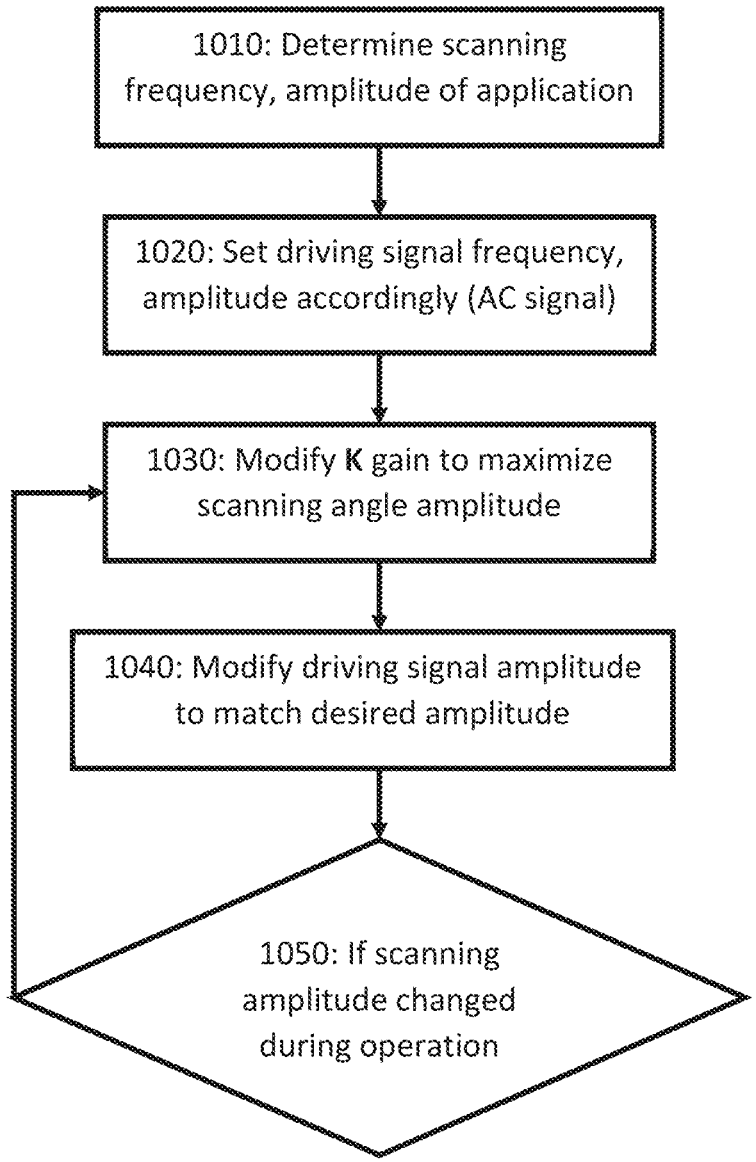
FIG. 5 is a simplified flowchart illustration of a method for tuning system resonance frequency according to certain embodiments; all or any subset of operations presented in FIG. 5 or elsewhere herein may be provided, suitably ordered e.g. as shown.

By actively manipulating the feedback K, the effective stiffness of the system is controlled. Consequently, the system's resonance frequency is tuned to a desired frequency e.g. as shown in FIG. 5.

Since the scanning frequency is predetermined, K is adaptively tuned by the frequency shift control to keep the scanning system in resonance. The manipulation of the frequency shift generator controls not only the gain K, but the phase of the torque $T_2$ relative to the measured sensor signal. This allows producing both negative and positive feedback torque (180 degrees phase shift) and also compensation for processing delays and electronic delays of the sensor and of the driver or power drive or motor drive.

Figure 3:
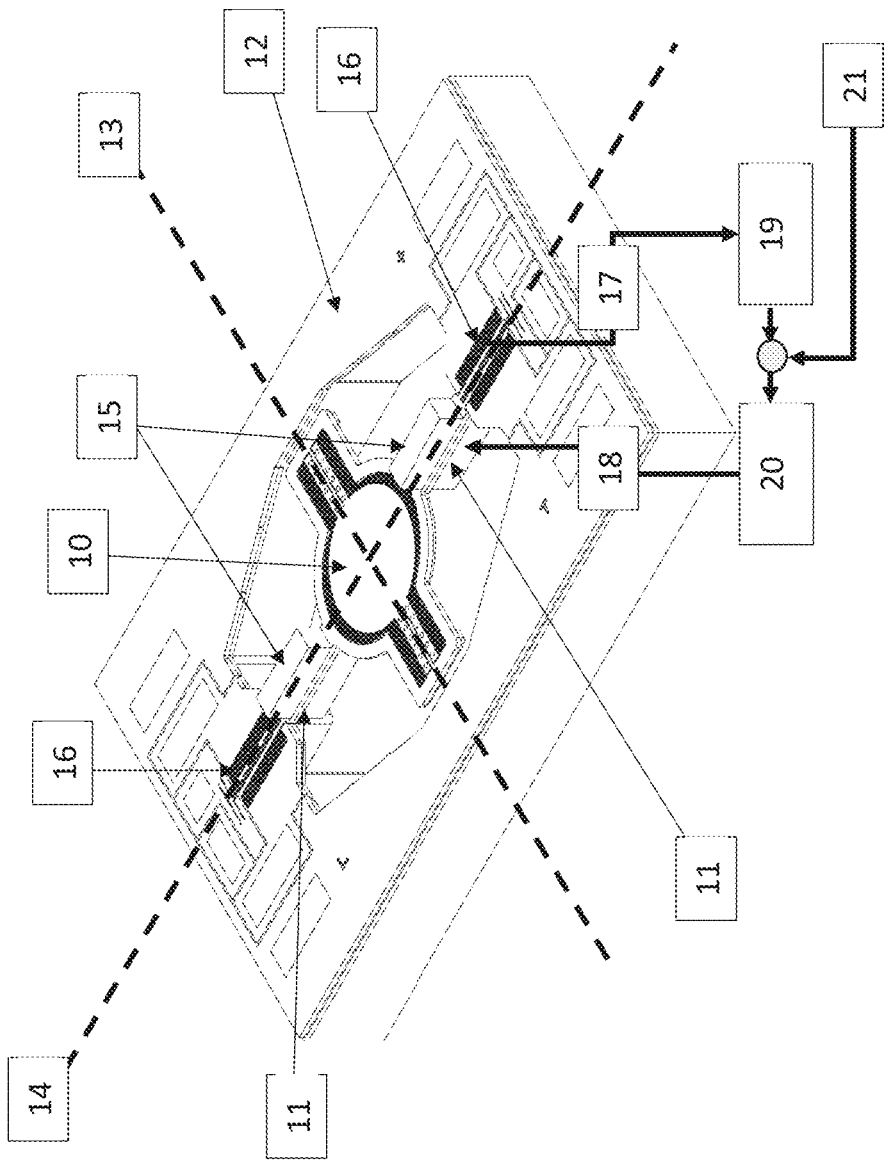
FIG. 3 is an isometric view of an example system according to certain embodiments.

FIG. 3 is a schematic diagram of an example system which adds, to a scanning mirror system, a virtual spring which changes the frequency at which the system operates e.g. if the operating frequency strays from the resonance frequency. In the diagram, reference numeral 10 denotes a scanning mirror, 11 denotes a hinge, 12 denotes a frame, 13 denotes an X scanning axis for the mirror, 14 denotes a Y scanning axis for the mirror, 15 denotes a Y motor, 16 denotes a Y motion sensor, 17 denotes data from sensor, 18 denotes voltage to motor, 19 denotes logic with functionality e.g. as described herein, 20 denotes a drive, and 21 denotes an AC driving signal.

The mirror aka "scanning mirror" is a typically round, typically flat element, typically formed of silicone and typically coated with a reflective coating. The mirror may be connected to a gimbal allowing the X pivot by two rods. The outer edge of the gimbal may be supported or held by two long rods or hinges or beams, allowing pivoting around the Y axis.

Typically, the virtual spring includes a sensor, logic, and a motor drive e.g. as shown.

Typically, a frequency control loop is provided which includes a sensor, logic, and a motor drive.

Sensors are typically embedded in the device; any suitable sensors may be employed such as but not limited to capacitance based sensors, which may be based on capacitors that change capacitance when the scanning angle changes, strain gauges, or piezoelectric based sensors.

The motor drive (aka "drive" or "driving mechanism") may include any electronic device which selectably injects power to the motor according to a command, which is provided by the logic.

Any type of motor may be employed e.g. to apply torque to the Y rods generating the Y pivot. The torsional flexibility of the rods causes them to behave like torsional springs.

The motor may, for example, include an electromagnetic motor, where, typically, coils around magnets apply power proportional to the electric current flowing in the coils. Or, the motor may be an electrostatic motor, in which case an electric field applies electrostatic force related to the voltage applied to the field. Or, the motor may be piezoelectric.

It is appreciated that the scanning mirror may include all or any subset of the properties and functionalities and elements of any embodiment described in co-owned U.S. Pat. No. 8,810,879 which describes scanning micro-mirror devices.

Any suitable method may be employed to build a scanning MEMS mirror with tunable resonance frequency in accordance with certain embodiments herein. For example, any or all of the following operations may be performed, suitably ordered e.g. as follows:

Operation 1: provide a MEMS mirror having at least one scanning axis whose resonance frequency is to be tuned. The mirror typically has an input interface to a power drive (e.g. voltage to drive an axial motor) and an output interface to an angular sensing signal (e.g. a signal indicating the angular position or instantaneous angle of the mirror).

Suitable commercially available MEMS mirrors are distributed, for example, by Maradin, as well as by mirrorcletech.com; Hamamatsu.com, and st.com.

Operation 2: create a scanning signal source by providing a signal generator that can generate a signal that is proportional to the desired scanning frequency and amplitude.

Operation 3: Measure the sensing signal and connect the sensing signal to a tunable amplifier than can increase/decrease the signal's magnitude by a tunable amplification factor K.

Operation 4: Combine the scanning source signal or scanning signal source with the amplified sensing signal to a driving signal. Connect the driving signal to the drive input of the mirror.

Operation 5: Tune amplification factor K to set the required resonance frequency. The closer the resonance frequency is to the scanning frequency, the more the magnitude of the angular position will increase, and vice versa:

the further the resonance frequency is from the scanning frequency, the more the magnitude of the angular position will decrease.

Figure 4:
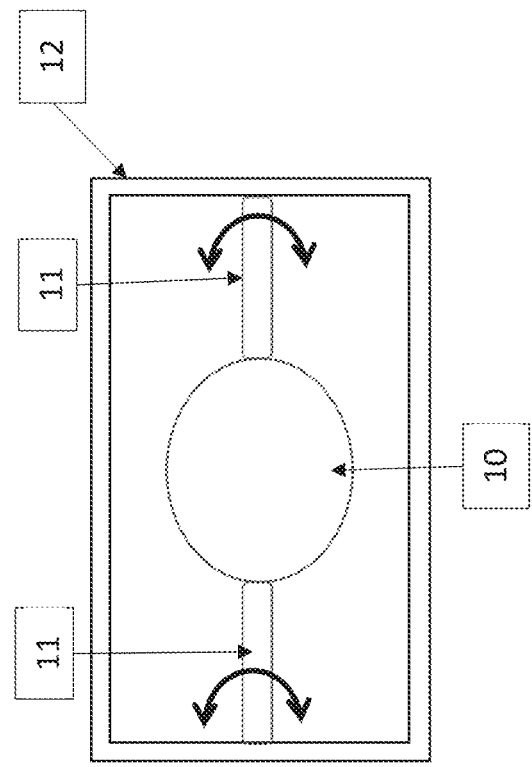
FIG. 4 is a simplified pictorial illustration of an example system according to certain embodiments.

It is appreciated that FIG. 3 is merely an example implementation. Many variations are possible. For example, more generally, the mirror in FIG. 3 may include any scanning mirror which may be connected via hinges to a frame, in accordance with an embodiment of the invention, e.g. as shown more generally in FIG. 4, in which reference numeral 10 denotes a mirror, 11 denotes a hinge, and 12 denotes a frame.

Also, either analog components can be used, or a digital implementation, e.g. in a CPU. For the latter, digital implementation, all signals described herein may be converted from analog to digital using a suitable ADC. The amplification by K is then carried digitally and the output is converted back to an analog drive signal. Also, tuning of K can occur either manually, or automatically e.g. by a feedback control system or virtual spring, as described herein, that modifies K to achieve the desired angular amplitude of the mirror's axis.

It is appreciated that embodiments herein have many use-cases, including inter alia technologies for which it is desirable that plural mirrors be synchronized to one another. For example, in display applications with use of 2 (say) mirrors in a Lissajous pattern, where the 2 mirrors oscillate with a fixed ratio, and there is a need to synchronize the mirrors to accurately determine timings of each pixel.

Also, in the case of a high power projection application, plural mirrors may need to be deployed one next to the other to form, together, an effective reflective aperture large enough to handle high laser power. The mirrors are typically synchronized to form a directed coherent light front.

An advantage of embodiments herein is that the stiffness of the system is modified without needing to apply static forces (DC voltage e.g.), without any feedback. Instead, feedback is provided; the stiffness of the system is modified by applying dynamic forces generated proportionally from the motion of the system and fed back to the system (e.g. AC voltage). This is in addition to the AC voltage that may be used to generate a driving signal.

A suitable method of operation for any of the apparatus shown and described herein is now described in detail.

Typically, a scanning mirror scans by carrying a periodic motion around an axis covering some angular section in space. The scanner can have multiple axes, around each of which a periodic motion occurs.

A single axis of a scanning MEMS mirror is sufficient for the purposes of embodiments herein. The mirror can have either single or dual axes. The embodiments herein may, for example, work on each axis independently.

It is desired to scan with a MEMS scanning mirror in its mechanical resonance frequency. This allows achieving large scanning angles with considerably low power.

During a scanning operation, the mechanical resonance frequency continuously changes. One approach would be to track the resonance frequency changes and modify the scanning frequency in real time to follow the mechanical resonance frequency changes [using many algorithms—PLL etc.].

Certain embodiments herein, rather than following or adapting to changes in the resonance frequency, instead actively maintain the resonance frequency at a desired or "target" frequency value.

A method for tuning resonance frequency or scanning frequency is now described in detail with reference to the simplified flowchart illustration of FIG. 5. The method may be used in conjunction with any of the embodiments illustrated and/or described herein. All or any subset of the illustrated operations (or of operations 1010, 1020, ... described below) may be performed, suitably ordered e.g. as illustrated or as per below.

Operation 1010: Determine the scanning frequency and amplitude of an application.

Typically, obtain, e.g. from the superior (user/application) level, the desired frequency and amplitude of an application (an input to the procedure). In the case of projection application, the amplitude is typically the desired field of view the scanning mirror is to cover according to the product design, typically defined as an angle e.g. 40 degrees.

The scanning frequency is determined depending on the time period that is allotted to the mirror to complete a single scan motion of the entire field of view, according to the product design, e.g. 10,000 Hz.

Operation 1020: Set frequency and amplitude of driving signal (=AC signal) accordingly e.g. driving signal's frequency and amplitude=scanning frequency and amplitude determined in operation 1010.

Typically, apply a driving signal having the desired frequency of scanning and desired AC amplitude. If the implementation is analog, changing the value of K is by changing the gain of the driver amplifier. If the implementation is digital, K is a number, which may be stored in system memory, and which is multiplied digitally by the measured instantaneous angle of the mirror to calculate the value of the driving signal. Changing the gain is carried out by changing the value of K.

Typically the driving signal is limited by the system power.

Operation 1030: Modify K gain to maximize the scanning angle amplitude.

Typically, while maintaining the driving signal's AC amplitude, K is increased by a certain amount, say by 1%. Thus, starting with K value of $K_0$ (for example $K_0=1$), increasing K once, or by a single unit, of 1%, yields $K=K_0+0.01K_0$. If, responsively, the amplitude of the application increases, the system may continue to increase K by 1% (or any other suitable unit/amount/increment) until maximal amplitude is obtained, or until further increases of K no longer increase the application's amplitude.

Typically, if the amplitude of the application begins to decrease as a result of increasing K, the system may decrease K, (e.g. $K=K_0-0.01K_0$) and continue to decrease K e.g. by 1% (or any other suitable unit/amount/increment) until a maximal amplitude is obtained or until further decreases of K no longer decrease the application's amplitude.

Tuning or modifying K may require increasing or decreasing, e.g. as described above.

Typically, K effectively changes the stiffness of the system, hence the amplitude of scan will be changed with K.

Typically, scan is assigned as the scanning frequency, and fn as the effective resonance frequency.

Typically, increasing K increases the effective resonance frequency, fn, and conversely, decreasing K decreases the effective resonance frequency, fn.

Typically, if K is increased or decreased and the scanning amplitude increases, this means that fn is getting closer to fscan.

Operation 1040: Modify driving signal amplitude to match the desired amplitude.

Typically, while tuning K, as the resonance frequency of the tuned system approaches the scanning frequency, the actual scanning amplitude may increase beyond the desired or target scanning amplitude. In this case, the AC amplitude of the driving signal may be modified to yield the target scanning amplitude defined in operation 1010. The driving signal's AC amplitude may be decreased to match the target application amplitude defined in operation 1010.

The procedure may end here if the scanning mirrors' mechanical resonance frequency does not change over time where the mechanical resonance frequency refers to the resonance of the mechanical system including mirror and flexible hinges, as opposed to the system resonance is the resonance of the system including mirror, flexible hinges and virtual spring.

Operation 1050: in practice, since the scanning mirrors are not stationary, their mechanical resonance frequency may change over time during system operation. Therefore, typically, the scanning amplitude is periodically or continuously measured or monitored, and if the mirrors' mechanical resonance frequency is found to have changed, the system typically re-tunes the value of K during the system operation, responsively. Typically operation 1050, performed each time the scanning amplitude changes during system operation (e.g. if driving signal amplitude in operation 1040 of iteration i, differs from the driving signal amplitude in operation 1040 of iteration i−1), includes beginning an iteration i+1 by returning to operation 1030.

It is appreciated that the force applied by the actuator or motor to the mirror is periodic, occurring each x period of time, e.g. because the driving signal is AC.

Typically, the mechanical resonance frequency is changed by modifying the stiffness of the scanning mirror's hinges. The logic is typically responsible for modifying the stiffness according to the desired resonance frequency. The stiffness is typically modified by applying a force which is proportional to the instantaneous angle of the mirror. The proportional coefficient is K. The "scanning angle amplitude" is the amplitude of the periodic scanning motion of the mirror. The forces applied to the mirror by the actuator/motor are typically periodic.

It is appreciated that any embodiment herein may have an operating frequency which may be instantaneous and may change continuously, a target frequency (aka scanning frequency=application frequency) which may be static, a mechanical resonance frequency of the mirror, which typically differs between mirrors and/or slowly changes over time, even for a single mirror, and, therefore, each mirror's mechanical resonance frequency almost never exactly coincides with the target frequency, and a system resonance frequency (e.g. of the system including not only the scanning mirror but also the virtual spring).

According to certain embodiments, the operating frequency is the target frequency aka AC signal frequency, which may be controlled as described herein.

It is appreciated that terminology such as "mandatory", "required", "need" and "must" refer to implementation choices made within the context of a particular implementation or application described herewithin for clarity, and are not intended to be limiting, since, in an alternative implementation, the same elements might be defined as not mandatory, and not required, or might even be eliminated altogether.

Components described herein as software may, alternatively, be implemented wholly or partly in hardware and/or firmware, if desired, using conventional techniques, and vice-versa. Each module or component or processor may be centralized in a single physical location or physical device or distributed over several physical locations or physical devices.

Included in the scope of the present disclosure, inter alia, are electromagnetic signals in accordance with the description herein. These may carry computer-readable instructions for performing any or all of the operations of any of the methods shown and described herein, in any suitable order including simultaneous performance of suitable groups of operations as appropriate. Included in the scope of the present disclosure, inter alia, are machine-readable instructions for performing any or all of the operations of any of the methods shown and described herein, in any suitable order; program storage devices readable by machine, tangibly embodying a program of instructions executable by the machine to perform any or all of the operations of any of the methods shown and described herein, in any suitable order i.e. not necessarily as shown, including performing various operations in parallel or concurrently rather than sequentially as shown; a computer program product comprising a computer useable medium having computer readable program code, such as executable code, having embodied therein, and/or including computer readable program code for performing, any or all of the operations of any of the methods shown and described herein, in any suitable order; any technical effects brought about by any or all of the operations of any of the methods shown and described herein, when performed in any suitable order: any suitable apparatus or device or combination of such, programmed to perform, alone or in combination, any or all of the operations of any of the methods shown and described herein, in any suitable order; electronic devices each including at least one processor and/or cooperating input device and/or output device and operative to perform, e.g. in software, any operations shown and described herein; information storage devices or physical records, such as disks or hard drives, causing at least one computer or other device to be configured so as to carry out any or all of the operations of any of the methods shown and described herein, in any suitable order; at least one program pre-stored e.g. in memory or on an information network such as the Internet, before or after being downloaded, which embodies any or all of the operations of any of the methods shown and described herein, in any suitable order, and the method of uploading or downloading such, and a system including server/s and/or client/s for using such; at least one processor configured to perform any combination of the described operations or to execute any combination of the described modules; and hardware which performs any or all of the operations of any of the methods shown and described herein, in any suitable order, either alone or in conjunction with software. Any computer-readable or machine-readable media described herein is intended to include non-transitory computer- or machine-readable media.

Any computations or other forms of analysis described herein may be performed by a suitable computerized method. Any operation or functionality described herein may be wholly or partially computer-implemented e.g. by one or more processors. The invention shown and described herein may include (a) using a computerized method to identify a solution to any of the problems or for any of the objectives described herein, the solution optionally including at least one of a decision, an action, a product, a service or any other information described herein that impacts, in a positive manner, a problem or objectives described herein; and (b) outputting the solution.

The system may, if desired, be implemented as a network e.g. web-based system employing software, computers, routers and telecommunications equipment as appropriate.

Any suitable deployment may be employed to provide functionalities e.g. software functionalities shown and described herein. For example, a server may store certain applications, for download to clients, which are executed at the client side, the server side serving only as a storehouse. Any or all functionalities e.g. software functionalities shown and described herein may be deployed in a cloud environment. Clients e.g. mobile communication devices, such as smartphones, may be operatively associated with, but external to the cloud.

The scope of the present invention is not limited to structures and functions specifically described herein, and is also intended to include devices which have the capacity to yield a structure, or perform a function, described herein, such that even though users of the device may not use the capacity, they are, if they so desire, able to modify the device to obtain the structure or function.

Any "if-then" logic described herein is intended to include embodiments in which a processor is programmed to repeatedly determine whether condition x, which is sometimes true and sometimes false, is currently true or false and to perform y each time x is determined to be true, thereby to yield a processor which performs y at least once, typically on an "if and only if" basis e.g. triggered only by determinations that x is true, and never by determinations that x is false.

Any determination of a state or condition described herein, and/or other data generated herein, may be harnessed for any suitable technical effect. For example, the determination may be transmitted or fed to any suitable hardware, firmware or software module, which is known or which is described herein to have capabilities to perform a technical operation responsive to the state or condition. The technical operation may, for example, comprise changing the state or condition, or may more generally cause any outcome which is technically advantageous given the state or condition or data, and/or may prevent at least one outcome which is disadvantageous given the state or condition or data. Alternatively or in addition, an alert may be provided to an appropriate human operator or to an appropriate external system.

Features of the present invention, including operations, which are described in the context of separate embodiments may also be provided in combination in a single embodiment. For example, a system embodiment is intended to include a corresponding process embodiment, and vice versa. Also, each system embodiment is intended to include a server-centered "view" or client centered "view", or "view" from any other node of the system, of the entire functionality of the system, computer-readable medium, apparatus, including only those functionalities performed at that server or client or node. Features may also be combined with features known in the art and particularly although not limited to those described in the Background section or in publications mentioned therein.

Conversely, features of the invention, including operations, which are described for brevity in the context of a single embodiment or in a certain order, may be provided separately or in any suitable sub-combination, including with features known in the art (particularly although not limited to those described in the Background section or in publications mentioned therein) or in a different order. "e.g." is used herein in the sense of a specific example which is not intended to be limiting. Each method may comprise all or any subset of the operations illustrated or described, suitably ordered e.g. as illustrated or described herein.

Devices, apparatus or systems shown coupled in any of the drawings may in fact be integrated into a single platform in certain embodiments, or may be coupled via any appropriate wired or wireless coupling such as but not limited to optical fiber, Ethernet, Wireless LAN, HomePNA, power line communication, cell phone, Smart Phone (e.g. iPhone), Tablet, Laptop, PDA, Blackberry GPRS, satellite including GPS, or other mobile delivery. It is appreciated that in the description and drawings shown and described herein, functionalities described or illustrated as systems and sub-units thereof can also be provided as methods and operations therewithin, and functionalities described or illustrated as methods and operations therewithin can also be provided as systems and sub-units thereof. The scale used to illustrate various elements in the drawings is merely exemplary and/or appropriate for clarity of presentation and is not intended to be limiting.

Any suitable communication may be employed between separate units herein e.g. wired data communication and/or in short-range radio communication with sensors such as cameras e.g. via WiFi, Bluetooth or Zigbee.

It is appreciated that implementation via a cellular app as described herein is but an example, and instead, embodiments of the present invention may be implemented, say, as a smartphone SDK, as a hardware component, as an STK application, or as suitable combinations of any of the above.

Any processing functionality illustrated (or described herein) may be executed by any device having a processor, such as but not limited to a mobile telephone, set-top-box, TV, remote desktop computer, game console, tablet, mobile e.g. laptop or other computer terminal, embedded remote unit, which may either be networked itself (may itself be a node in a conventional communication network e.g.) or may be conventionally tethered to a networked device (to a device which is a node in a conventional communication network or is tethered directly or indirectly/ultimately to such a node).

Any operation or characteristic described herein may be performed by another actor outside the scope of the patent application and the description is intended to include apparatus, whether hardware, firmware or software, which is configured to perform, enable or facilitate that operation or to enable, facilitate or provide that characteristic.

The terms processor or controller or module or logic as used herein are intended to include hardware such as computer microprocessors or hardware processors, which typically have digital memory and processing capacity, such as those available from, say Intel and Advanced Micro Devices (AMD). Any operation or functionality or computation or logic described herein may be implemented entirely or in any part on any suitable circuitry including any such computer microprocessor/s, as well as in firmware or in hardware, or any combination thereof.

It is appreciated that elements illustrated in more than one drawing, and/or elements in the written description, may still be combined into a single embodiment, except if otherwise specifically clarified herewithin. Any of the systems shown and described herein may be used to implement or may be combined with, any of the operations or methods shown and described herein.

It is appreciated that any features, properties, logic, modules, blocks, operations or functionalities described herein which are, for clarity, described in the context of separate embodiments, may also be provided in combination in a single embodiment, except where the specification or general knowledge specifically indicates that certain teachings are mutually contradictory and cannot be combined. Any of the systems shown and described herein may be used to implement or may be combined with, any of the operations or methods shown and described herein.

Conversely, any modules, blocks, operations or functionalities described herein, which are, for brevity, described in the context of a single embodiment, may also be provided separately, or in any suitable sub-combination, including with features known in the art. Each element e.g. operation described herein, may have all characteristics and attributes described or illustrated herein, or, according to other embodiments, may have any subset of the characteristics or attributes described herein.

The invention claimed is:

1. A method for projecting an image comprising:
   providing a scanning mirror having a resonance frequency which is unequal to a target operating frequency (aka "scanning frequency") at which the mirror is to operate;
   providing logic and an actuator e.g. motor; and
   using the scanning mirror to project at least one image, including repeatedly using the logic to measure the mirror's operating frequency and to control the actuator to apply at least one force, to the mirror, which causes the mirror's instantaneous operating frequency to equal the target operating frequency;
   the method also comprising providing a sensor of the mirror's position or scanning angle which measures a signal proportional to the periodic scanning motion and, responsively, provides a reading to the logic which receives said reading, multiplies the reading by a constant thereby to obtain a scalar number, and commands the motor to apply a second force, whose magnitude equals the scalar number, to the mirror, wherein the logic multiplies the reading by a spring constant.

2. The method of claim 1 wherein the logic is configured to modify stiffness of the scanning mirror's hinges, according to a target resonance frequency, and wherein the stiffness is modified by controlling the actuator to apply said force to the mirror and wherein said force, at a given instant, is proportional to the instantaneous angle of the mirror.

3. The method of claim 1 wherein said logic, at least once, sets a driving signal's amplitude to a target application's amplitude, including:
   repeatedly adjusting aka modifying a coefficient K (aka K gain value), to yield a K gain value which maximizes the amplitude of the periodic scanning motion of the mirror (aka scanning angle amplitude), and
   setting the logic driving signal's amplitude to K times the scanner's instantaneous angle relative to the scanning direction.

4. The method of claim 1 wherein said logic, at least once, sets a driving signal's amplitude to a target application's amplitude, including:
   repeatedly adjusting aka modifying a K gain value, to yield a K gain value which maximizes scanning amplitude; and
   setting the logic driving signal's amplitude to K times the scanner's amplitude.

5. An image projection system comprising:
   a scanning mirror having an operating frequency which is, on a at least one occasion, unequal to a target frequency at which the mirror is to operate;
   an actuator; and
   logic which controls the scanning mirror to project at least one image, including repeatedly providing a measurement of the scanning mirror's operating frequency, and, responsively, controlling the actuator to apply at least one force, to the mirror, which causes the mirror's instantaneous operating frequency to equal the target frequency, thereby to enhance image quality by maintaining a uniform operating frequency over time;
   the system also comprising a sensor of the mirror's position or scanning angle which measures a signal proportional to the periodic scanning motion;
   wherein the logic receives a reading from the sensor, multiplies the reading by a constant thereby to obtain a scalar number, and commands the motor to apply a second force, whose magnitude equals the scalar number, to the mirror, wherein the logic multiplies the reading by a spring constant.

6. The system of claim 5 wherein the mirror comprises a gimballed mirror.

7. The system of claim 5 wherein said actuator comprises at least one motor operatively associated with the mirror to apply torque thereto, thereby to yield periodic scanning motion of the mirror.

8. The system of claim 7 and also comprising:
   at least one driving mechanism aka drive which drives the at least one motor; and
   a signal generator aka frequency shift controller which generates a signal with a gain and phase shift relative to the measured angular position, that controls the drive including setting the periodic scanning motion's frequency.

9. The system of claim 5 and where the logic is configured to ensure that periodic motions of all scanning mirrors from a given batch of scanning mirrors, all have a single operating frequency, thereby to provide a batch of scanning mirrors whose periodic motion's operating frequencies all equal a single target resonance frequency value, even though the resonance frequencies, of mirrors in the batch, differ within the batch due to mechanical structures of mirrors in the batch which differ within the batch due to manufacturing divergences and tolerances.

10. The system of claim 8 wherein said logic, aka frequency shift controller, is configured to change at least one input parameter to the signal generator.

11. The system of claim 8 wherein the at least one motor and at least one driving mechanism comprises one motor and one driving mechanism.

12. The system of claim 8 wherein the at least one motor and at least one driving mechanism comprises at least two motors driven respectively by at least two driving mechanisms.

13. The system of claim 5 wherein the mirror comprises a 2D MEMS mirror whose mechanical structure defines a resonance frequency, and wherein said operating frequency is sometimes higher than the resonance frequency.

14. The system of claim 5 wherein the mirror comprises a 2D MEMS mirror whose mechanical structure defines a resonance frequency, and wherein the target frequency comprises the 2D MEMS mirror's resonance frequency, and wherein said operating frequency is sometimes lower than the resonance frequency.

15. The system of claim 5 wherein the mirror comprises a 2D MEMS mirror whose mechanical structure defines a resonance frequency, and wherein the target frequency comprises the 2D MEMS mirror's resonance frequency, and wherein said operating frequency is sometimes higher than and sometimes lower than the resonance frequency.

16. The system of claim 12 wherein the two driving mechanisms are set to be AC,
   and wherein two separately controllable control loops form a tunable virtual suspension which changes the resonance frequency of the MEMS.

17. The system of claim 16 wherein the resonance frequency of the MEMS changes both to higher and to lower frequencies.

18. The system of claim 12 wherein the at least two driving mechanisms are set to be AC,
- and wherein at least two separately controllable control loops form a tunable virtual suspension which changes the resonance frequency of the MEMS.

19. The system of claim 5 wherein the logic is configured to maintain a constant scanning amplitude within a constant frequency.

20. The method of claim 1 wherein said logic resets the driving signal's amplitude each time the scanning amplitude, aka scanning angle amplitude, is found to have changed.

* * * * *